(12) United States Patent
Nakahama (10) Patent No.: US 10,138,363 B2
(45) Date of Patent: Nov. 27, 2018

(54) RUBBER COMPOSITION FOR PHOTOVOLTAIC THERMAL COLLECTOR

(71) Applicant: NISSHINBO MECHATRONICS INC., Tokyo (JP)

(72) Inventor: Hidenari Nakahama, Aichi (JP)

(73) Assignee: NISSHINBO MECHATRONICS INC., Tokyo (JP)

( * ) Notice: Subject to any disclaimer, the term of this patent is extended or adjusted under 35 U.S.C. 154(b) by 0 days.

(21) Appl. No.: 15/709,484

(22) Filed: Sep. 20, 2017

(65) Prior Publication Data

US 2018/0030254 A1    Feb. 1, 2018

Related U.S. Application Data

(63) Continuation of application No. PCT/JP2016/057692, filed on Mar. 11, 2016.

(30) Foreign Application Priority Data

Mar. 20, 2015    (JP) ................. 2015-057152

(51) Int. Cl.
*C08L 23/08*    (2006.01)
*C08K 5/00*    (2006.01)
(Continued)

(52) U.S. Cl.
CPC ............ *C08L 23/0815* (2013.01); *C08K 3/04* (2013.01); *C08K 3/041* (2017.05); *C08K 5/0025* (2013.01); *C08K 5/14* (2013.01); *C08L 23/04* (2013.01); *C08L 23/16* (2013.01); *H02S 30/00* (2013.01); *H02S 40/44* (2014.12); *C08F 210/16* (2013.01);
(Continued)

(58) Field of Classification Search
CPC ..... C08L 23/0815; C08K 3/04; C08K 5/0025; C08K 5/14; C08F 210/16
See application file for complete search history.

(56) References Cited

U.S. PATENT DOCUMENTS

2012/0068125 A1*  3/2012  Yoshitake ................ B01J 23/78
                                                                252/511

FOREIGN PATENT DOCUMENTS

CN        1318586      10/2001
CN        1611535       5/2005
(Continued)

OTHER PUBLICATIONS

"Written Opinion of the International Searching Authority (Form PCT/ISA/237) of PCT/JP2016/057692", dated May 24, 2016, with English translation thereof, pp. 1-7.
(Continued)

*Primary Examiner* — Robert D. Harlan
(74) *Attorney, Agent, or Firm* — JCIPRNET (57) ABSTRACT

The present invention provides a rubber compound used in a hot-water producing portion for a photovoltaic thermal collector that produces hot water on a back-surface side using heat produced through power generation on a front-surface side of a solar panel.
There is provided a rubber compound: by using the rubber compound, it is possible to simultaneously form a power generating portion and a hot-water producing portion in a regular photovoltaic module forming line without cracking of a crystalline silicon cell used in the solar panel and without crushing of a channel of a resin pipe used in the hot-water producing portion.

5 Claims, 3 Drawing Sheets

(51) Int. Cl.
   *C08K 5/14*    (2006.01)
   *C08K 3/04*    (2006.01)
   *H02S 30/00*   (2014.01)
   *H02S 40/44*   (2014.01)
   *C08L 23/04*   (2006.01)
   *C08L 23/16*   (2006.01)
   *C08F 210/16*  (2006.01)
   *H01L 31/0525* (2014.01)

(52) U.S. Cl.
   CPC ...... *C08F 2500/18* (2013.01); *H01L 31/0525* (2013.01)

(56) References Cited

FOREIGN PATENT DOCUMENTS

| | | |
|---|---|---|
| CN | 101516987 | 8/2009 |
| JP | 58-164953 A * | 9/1983 |
| JP | S58-164953 | 9/1983 |
| JP | H10-281563 | 10/1998 |
| JP | 2001-007412 | 1/2001 |
| JP | 2003-318432 | 11/2003 |
| JP | 2003-318432 A * | 11/2003 |
| JP | 2007-081097 | 3/2007 |
| TW | 2012-07025 A * | 2/2012 |
| TW | 201207025 | 2/2012 |

OTHER PUBLICATIONS

"Office Action of Japan Counterpart Application", dated Jul. 5, 2017, p. 1-p. 4, in which the listed references were cited.

"Office Action of Canada Counterpart Application," dated Dec. 6, 2017, p. 1-p. 4.

"Office Action of Taiwan Counterpart Application," dated Oct. 20, 2017, with English translation thereof, p. 1-p. 9, in which the listed reference was cited.

"Office Action of China Counterpart Application," dated May 18, 2018, with English translation thereof, pp. 1-11.

"Office Action of Canada Counterpart Application," dated Jun. 14, 2018, p. 1-p. 3.

* cited by examiner

RUBBER COMPOSITION FOR PHOTOVOLTAIC THERMAL COLLECTOR

CROSS-REFERENCE TO RELATED APPLICATION

This application is a Continuation of PCT International Application No. PCT/JP2016/057692, filed on Mar. 11, 2016, which claims priority under 35 U.S.C. § 119(a) to Japanese Patent Application No. 2015-057152, filed on Mar. 20, 2015. Each of the above applications is hereby expressly incorporated by reference, in their entirety, into the present application.

FIELD OF THE INVENTION

The present invention relates to a rubber composition and a use of the rubber composition (hereinafter, rubber compound). To be more specific, the present invention relates to a rubber compound that has a seal function, a structural function, and sufficient water resistance to be used for a photovoltaic thermal collector:the rubber compound comes into close contact with a resin pipe though which a liquid for producing hot water moves; and the external appearance of the photovoltaic thermal collector is deformed to the least extent even when a resin pipe is held at water pressure of 0.2 MPa or higher and 1.0 MPa or lower at 25° C. for 24 hours.

DESCRIPTION OF THE BACKGROUND ART

In the conventional art, in order to effectively use solar energy, a photovoltaic thermal hybrid solar collector that obtains electricity and heat is commercially available and is introduced to general houses. Energy efficiency of a photovoltaic thermal collector is about 20% at most, and 80% of solar energy is heat. The energy efficiency of the photovoltaic module is only 20%; however, heat collection efficiency is about 50%. Hence, a photovoltaic thermal collector having the heat collection efficiency has been actively studied for 20 years.

Regarding photovoltaic power generation, a system that has solar panels installed on a roof of a house and meets a household power demand has been put to practical use. In addition, as for solar thermal power generation, generation from solar heat as a heat source through thermoelectric conversion using a thermoelectric conversion element having the Seebeck effect has been known.

However, a photovoltaic power generation system has problems in that solar energy density is not only low on the earth's surface, but also is likely to vary depending on the influence of weather conditions or sunshine duration. In other words, arises a problem that the influence makes it difficult to stably obtain power. In addition, in a solar thermal power generation system using the thermoelectric conversion elements, currently-known thermoelectric conversion elements have low performance, and there arises a problem that it is difficult to obtain sufficient power generation efficiency.

Japanese Unexamined Patent Publication No. 2007-81097 (Patent Document 1) and Japanese Unexamined Patent Publication No. 2001-7412 (Patent Document 2) propose a photovoltaic thermal collector that is capable of efficiently using solar energy. Specifically, the patent documents propose in the photovoltaic thermal collector: a solar panel is combined with a solar thermal electric generation apparatus having thermoelectric conversion elements that convert thermal energy from sunlight into electrical energy. According to the photovoltaic thermal collector, the solar thermal energic generation apparatus compensates for shortcomings that generation efficiency is likely to be influenced by conditions of cloudy weather, night time or the like; and the solar panel compensates for shortcoming that generation efficiency of the thermoelectric conversion elements themselves is not enough. Patent Document 1 discloses that it is possible to stably obtain higher power by about 5% or higher and 15% or lower than an amount of power obtained in a configuration including only the solar panel.

However, in the photovoltaic thermal hybrid photovoltaic thermal collector disclosed in Patent Document 1, since the solar thermal power generation is performed through power generation by the thermoelectric conversion elements, power obtained from the solar thermal power generation is normal. Hence, the photovoltaic thermal collector is considered only as a technology of compensating for defect of solar panels for a household or an office building. Nowadays, there is a demand for technology that compensates for power shortage without building a new nuclear power plant. In this respect, the technology disclosed in Patent Document 1 is not sufficient for the demand.

Herein, a photovoltaic thermal hybrid power generation system through collection or semi-collection of light is being considered. For example, such a system or the like includes: a light collecting mirror provided with an infrared reflective film formed on a front surface thereof; a heat collecting portion that collects infrared rays reflected on the infrared reflective film on the front surface of the light collecting mirror; a generator provided with a turbine that rotates by steam generated with heat collected by the heat collecting portion; and a solar panel including photovoltaic cells disposed inside the light collecting mirror. The system or the like is large-sized equipment and is very expensive.

A thermal photovoltaic hybrid product which has been practically studied so far is made of a solar panel and a conventional hot-water panel stuck each other. Therefore, a problem such as copper-pipe corrosion or water leakage remains as is.

A light collecting type has good thermal efficiency; however, an initial investment amount is high, an installation space is large, and thus there are many problems that need to be solved for a widespread use of the type.

[Patent Document 1] Japanese Unexamined Patent Publication No. 2007-81097

[Patent Document 2] Japanese Unexamined Patent Publication No. 2001-7412

SUMMARY OF THE INVENTION

The present invention is made in consideration of the above circumstances, and an object thereof is to provide an olefinic rubber compound which enables production of a photovoltaic thermal collector with manufacturing equipment of a solar panel business as is.

Three hundred million sheets of solar panels are produced in the world per year, and costs are reduced year by year due to an increase in amount. In addition, costs of photovoltaic module related members remarkably decrease year by year due to an installation method or a simplification technology. By using such members, a production line, a delivery system, an installation method, and the like, it is possible to produce the photovoltaic thermal collector at a remarkably low cost. Specifically, the present invention provides an olefinic rubber compound used in photovoltaic thermal collector. The olefinic rubber compound has configuration as follows: an existing member is applied to a power generating portion; a resin pipe without corrosion is applied instead of a copper pipe; the olefinic rubber compound adheres to a solar panel, further encloses the resin pipe and adheres thereto.

In order to achieve the above-mentioned object, an olefinic rubber compound according to the first invention is characterized as follows.

An olefinic rubber compound wherein the olefinic rubber compound adheres to a surface opposite to a light receiving side (anti-light receiving side) of a photovoltaic module, and the olefinic rubber compound has a thermal conductivity of 0.3 (W/mK) or higher, a rubber hardness (Japanese Industrial Standards A; JISA) of 80 or higher and 90 or lower, a mechanical strength of 10 MPa or higher, an elongation of 150% or higher and 700% or lower, and an amount of acetone extract of 5% or smaller.

In case the thermal conductivity of the rubber compound is 0.3 (W/mK) or lower, heat transmission from a lower heat plate of a laminating apparatus deteriorates when a photovoltaic thermal collector is produced, and the external appearance of the photovoltaic thermal collector on a power generating portion (a solar panel) deteriorates due to foam or the like. In addition, a degree of cross-linkage of the rubber compound decreases, and mechanical strength is insufficient as a photovoltaic thermal collector (hot-water hybrid module). It is preferable that the thermal conductivity is 0.4 or higher, and the higher the thermal conductivity is, the more preferable.

In case the rubber hardness is lower than 80, flow-property of rubber increases at pressure during laminating process, the resin pipe is crushed, and thus it is not possible to secure a channel. Conversely, it is not preferable that the rubber hardness is higher than 90 because rubber does not flow entirely.

In case mechanical strength of the rubber compound is lower than 10 MPa, the water pressure resistance thereof is insufficient.

It is not preferable that the elongation is lower than 150% because the rubber compound is brittle to strong external force. In case the elongation is higher than 700%, the rubber compound is likely to be deformed, and thus reliability thereof decreases. Preferably, the elongation is 300% or higher and 600% or lower.

It is not preferable that the amount of acetone extract is larger than 5% because a low-molecular-weight component such as oil permeates through the resin pipe and water-pressure resistance performance thereof decreases. Preferably, the amount of acetone extract is 3%, and most preferably, 0%.

According to the rubber compound of the first invention, it is possible to easily manufacture a photovoltaic thermal collector which generates power from sunlight and produces hot water with solar heat, with laminating apparatus or the like for manufacturing solar panel through which only power generation is performed. Further the obtained photovoltaic thermal collector has a remarkable long-life, and is lightweight and further low in cost, compared to a solar water heater.

According to the first invention, in the olefinic rubber compound of the second invention, the olefinic rubber compound is an ethylene-α-olefin copolymer.

According to the first invention, the olefinic rubber compound of the third invention includes conductive carbon black, carbon nanotubes, and fillers.

According to the first invention, the olefinic rubber compound of the fourth invention includes an organic peroxide cross-linker of which a one-minute half-life temperature is 182° C. or lower.

According to the first invention, the olefinic rubber compound of the fifth invention includes polyethylene resin having a density of 0.89 or higher and 0.92 or lower, in which a content of the polyethylene resin is 10 parts or higher by weight and 35 parts or lower by weight. The content of polyethylene resin is preferably 15 parts or higher and 25 parts or lower by weight.

Other features and advantages of the present invention will be apparent from the following description when taken in conjunction with the accompanying drawings, in which like reference characters designate similar or identical parts throughout the several views thereof.

DETAILED DESCRIPTION

A detailed description will now be given of illustrative embodiments of the present invention, with reference to the accompanying drawings. In so doing, specific terminology is employed solely for the sake of clarity, and the present disclosure is not to be limited to the specific terminology so selected. It is to be understood that each specific element includes all technical equivalents that operate in a similar manner and achieve a similar result.

Hereinafter, an olefinic rubber compound of the present invention will be described in detail with reference to FIGS. 1, 2 and 3 and Table 1.

<1> Photovoltaic Thermal Collector

First, the photovoltaic thermal collector using an olefinic rubber compound of the present invention is described.

The photovoltaic thermal collector can be produced through a regular molding line that manufactures a solar panel that performs only photovoltaic power generation. The photovoltaic thermal collector has a cross-sectional structure illustrated in FIGS. 1, 2, and 3. The manufacturing process is as follows: Front-surface glass 22, a sealing member 23, power generating elements (photovoltaic cells) 21, the sealing member 23, and a back sheet 24 are piled as the laid-up product (A); then, a rubber compound 50 of the present invention which has a shape of sheet having the same thickness as an outer diameter of a resin pipe 30 is spread on the laid-up product (A); then, a back-surface-side plate 51 made of glass, metal, or resin is piled as the laid-up product (B), and a photovoltaic thermal collector is molded through laminating the laid-up product (B). In the present invention, the photovoltaic cell 21 may be not only a crystalline type using a silicon cell, but also a thin film type in which the power generating element is produced through vapor deposition.

Figure 1:
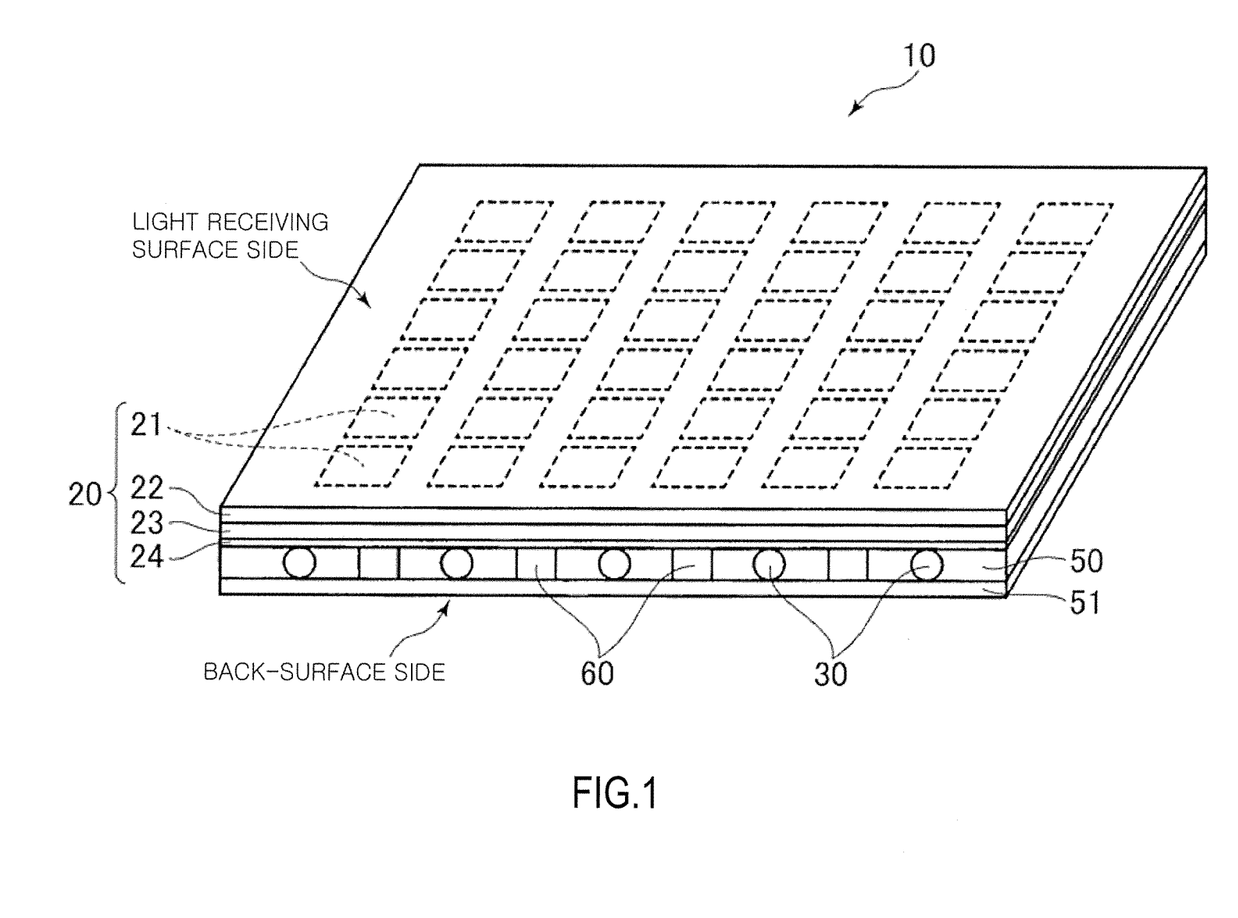
FIG. 1 is a perspective view showing a schematic configuration of a photovoltaic thermal collector using a rubber compound of the present invention.
Figure 2:
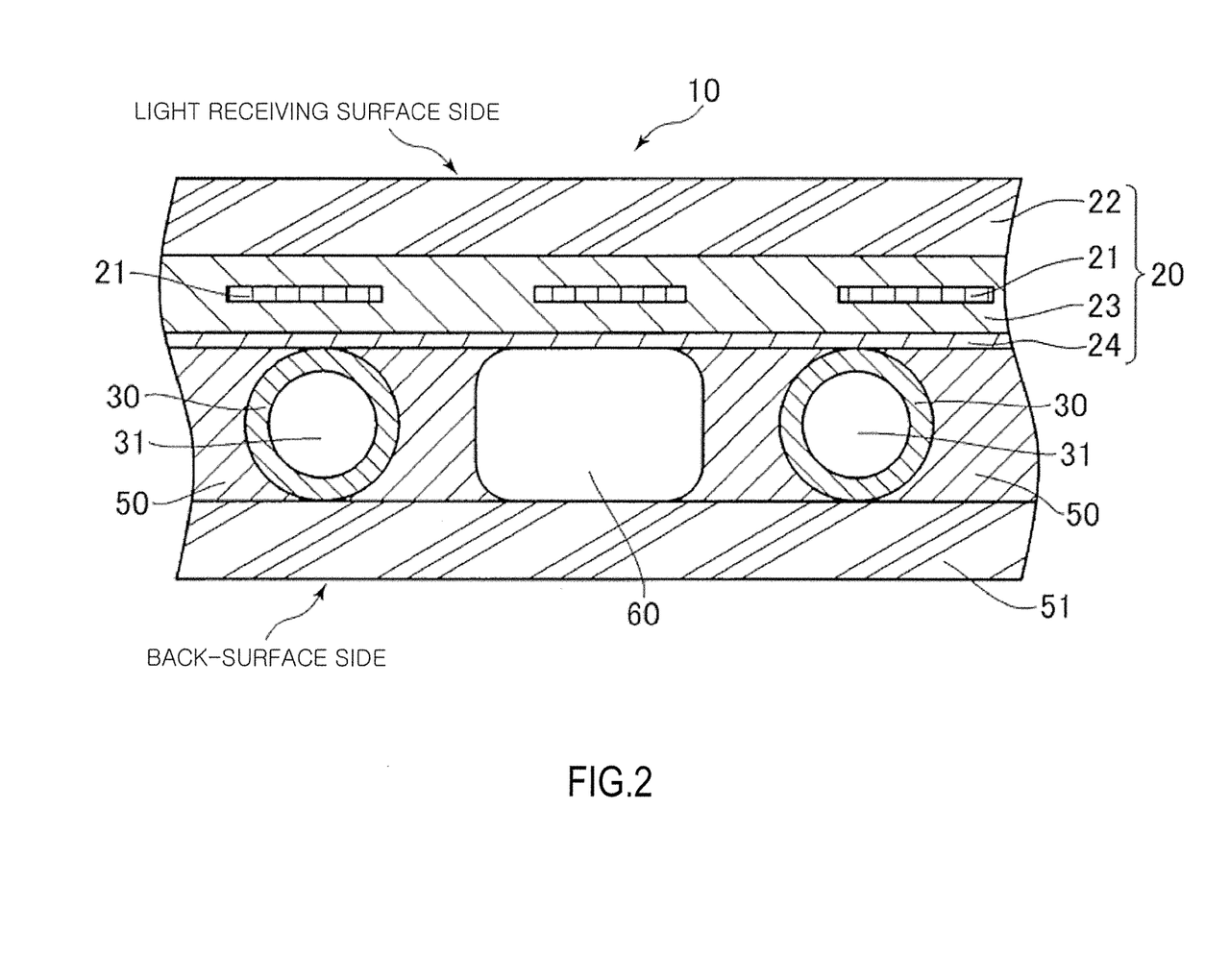
FIG. 2 is a sectional view showing the photovoltaic thermal collector using an olefinic rubber compound of the present invention.
Figure 3:
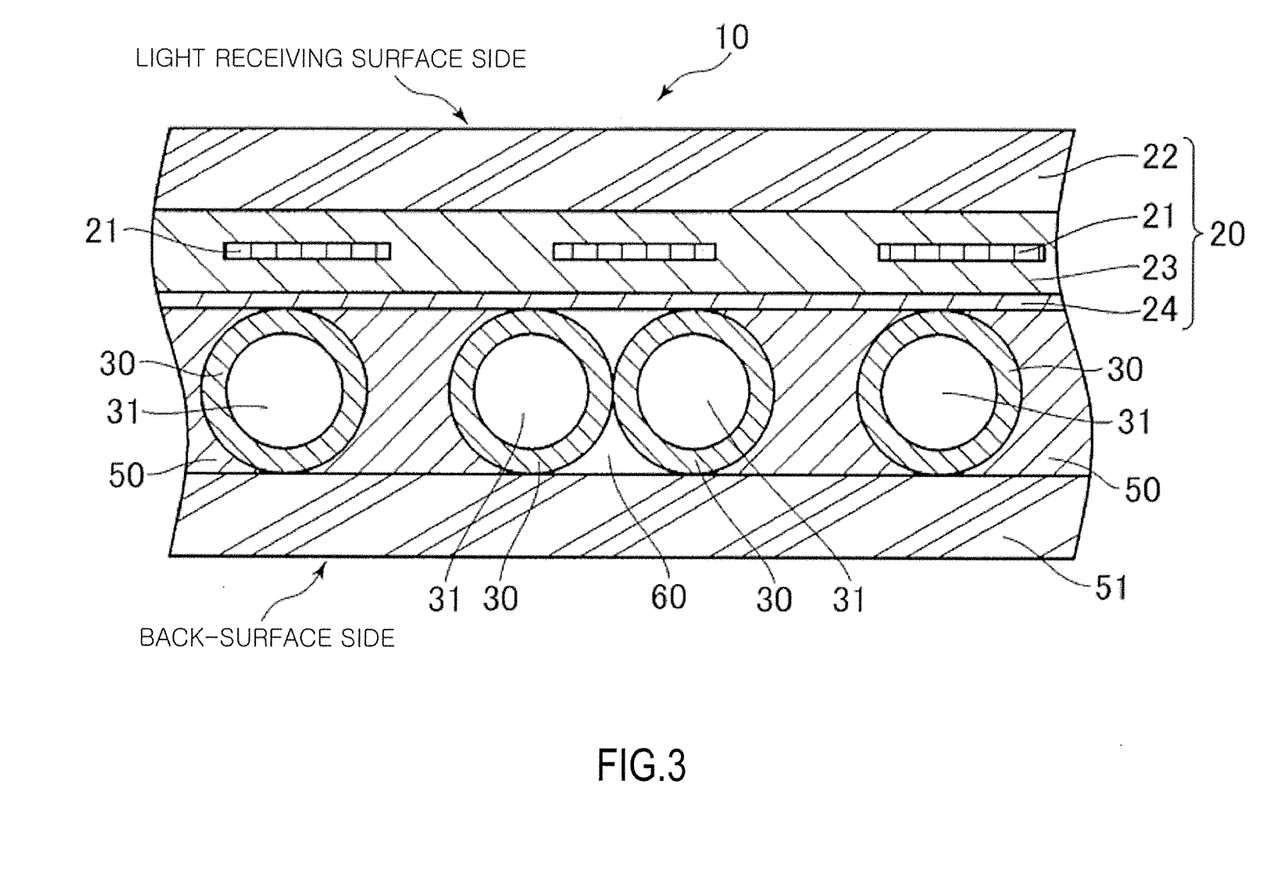
FIG. 3 is a sectional view showing a photovoltaic thermal collector of another configuration using the olefinic rubber compound of the present invention.

FIG. 1 is a perspective view of the photovoltaic thermal collector, and FIGS. 2 and 3 are sectional views of the photovoltaic thermal collector. A photovoltaic thermal collector 10 includes a solar panel 20 having photovoltaic cells 21, and the resin pipes 30 on the back side of the solar panel 20. The solar panel and the resin pipes adhere to each other with the rubber compound 50 to be integrally combined. Then, the object of the present invention is that: a liquid such as water or an antifreeze flows through the resin pipe 30; and a temperature of the liquid flowing into a resin pipe inside 31 increases by using solar heat received by the solar panel 20. In a case where the liquid is water, tap water is directly supplied, hot water is produced on the back of the solar panel, and then the hot water is temporarily stored in a tank. The hot water continuously flows to an electric water heater, Ecocute, a boiler, or the like in which the hot water is rewarmed to reach a predetermined temperature, and thereby it is possible to use the hot water in not only a facility such as a bathhouse facility that needs a large amount of hot water, but also in an ordinary household. In general, an antifreeze is used, and tap water is changed into hot water with a heat exchanger.

A photovoltaic thermal collector 10 includes front-surface glass 22 on a light receiving side and back-surface glass 51 on the back surface side, and has configuration that the solar panel 20 and resin pipes 30 are sandwiched thereby. In a configuration that the photovoltaic thermal collector is sandwiched between such two sheets of glass (22 and 51), a heat storage effect increases, and further it is possible to increase strength of a water-pressure resistance structure of the entire panel. The sealing member 23 is used for adhesion of the front-surface glass 22, the back sheet 24, and the photovoltaic cells 21 of the solar panel 20. An ethylene-vinyl acetate copolymer (EVA) may be used as the sealing member 23. In addition, the rubber compound of the present invention is used for adhesion of the back sheet 24, the back-surface glass 51, and the resin pipes 30.

In the conventional art, a pipe made of steel (or copper) has been used as a heat collecting pipe that absorbs such solar heat. However, in a case where the pipe is integrally disposed with the solar panel 20, the pipe has to perform its function for long time. In addition, in case the pipe is made of steel (or copper), heat is quickly released. Hence, a large amount of heat insulation needs to be used. As a result, the costs and weight increase, which results in a loss of economic efficiency. In the present invention, the resin pipe 30 having good corrosion resistance and characteristics of low-heat release is employed. Polyethylene resin, silicone resin, fluororesin, vinyl chloride, or the like may be used as a material of the resin pipe 30; however, olefinic resin is preferable, and particularly cross-linked polyethylene resin pipe or polybutene resin pipe is optimum.

<2> Olefinic Rubber Compound

Next, the olefinic rubber compound of the present invention will be described. In the following description, the "olefinic rubber" compound is referred to as "rubber compound".

<2-1> Mechanical Properties or the Like of Crosslinked Rubber

Hardness (JISA) of crosslinked rubber of the olefinic rubber compound of the present invention is 80 or higher and 90 or lower. Preferably, the hardness is 83 or higher and 88 or lower. In case the hardness is lower than 80, the resin pipe 30 is crushed, and it is not possible to secure a channel 31 in FIGS. 2 and 3. In case the hardness is higher than 90, it is difficult to deform the rubber compound at atmospheric pressure when a laminating process of the photovoltaic thermal collector is performed, and a portion in which the back surface (back sheet surface) of the solar panel is unlikely to adhere to the resin pipe will occur. As a result, practical water pressure resistance cannot be obtained. In addition, in case the mechanical strength of rubber is lower than 10 MPa, the photovoltaic thermal collector may be damaged due to water pressure. In case elongation of the rubber is lower than 150%, the photovoltaic thermal collector cannot endure contraction and expansion, becomes brittle and is broken in the situation where the photovoltaic thermal collector is exposed to a heat cycle of −40° C. or higher and 100° C. or lower. It is not preferable that the elongation of the rubber is higher than 700% because: the photovoltaic thermal collector performs no-water heating due to a blackout or the like in actual use and has an increase in temperature; and in case the resin pipes are remarkably deformed, the rubber compound is significantly deformed and cracks the silicon cell on the front surface side of the solar panel. It is preferable that thermal conductivity is lower than 0.3 (W/mK) because: in a normal processing time in the situation where the photovoltaic thermal collector is manufactured through a laminating process (molding), heat transmission deteriorates; a molded body (photovoltaic thermal collector) cannot be obtained; the external appearance has a defect such as bubble generation on the solar panel side; molding tact needs to be long; and the long molding tacts results in an increase in processing costs.

<2-2> Composition of Rubber Compound

The rubber compound of the present invention uses Mitsui EPT4021. A preparation method of the rubber compound of the present invention is as follows, EPDM is kneaded with components such as a rubber reinforcing agent, inorganic fillers, and a softener, preferably at a temperature of 90° C. or higher and 180° C. or lower for 3 minutes or longer and 40 minutes or shorter by a bunbury mixer, a kneader, a planetary mixer, a type of internal mixer (closed mixer) such as intermix, or a kneading apparatus such as two rolls or three rolls; and then an organic peroxide cross-linker is added at a temperature lower than 100° C. by using a roll type of open roll or a kneader; and a crosslinking aid such as an acrylic acid may be added as necessary.

Further, the rubber compound of the present invention can be appropriately compounded with an additive such as a rubber reinforcing agent, inorganic fillers, an antioxidant, a processing aid, a vulcanization accelerator, an organic peroxide, a crosslinking aid, a dispersing agent, or a fire retardant which is known in the conventional art, as necessary for use of a crosslinked material in a range in which the object of the present invention is not impaired.

The rubber reinforcing agent is used to enhance mechanical properties such as tensile strength, tear strength, or wear resistance of the crosslinked (vulcanized) rubber. For examples, carbon black, fine-powder hydrated silicic acid, silica, or the like may be used as rubber reinforcing agent. The content of a rubber reinforcing agent is set in a range in which hardness of a crosslinked body of the rubber compound of the present invention is 80 or higher and 90 or lower. Preferably, ketjen black, acetylene black, carbon nanotubes, or the like as conductive carbon black is added to 100 parts by weight of Mitsui EPT4021. Furnace black such as FEF or SRF appropriately added thereto. It is possible to use a single or a combination of two or more of such rubber reinforcing agents.

For examples, the inorganic fillers are light calcium carbonate, heavy calcium carbonate, talc, clay, diatomaceous earth, and the like. It is possible to use a single or a combination of two or more of such inorganic fillers.

A known softener contained in regular rubber can be used as a softener; however, it is preferable that little softener is used. For examples, softeners are: a petroleum softener such as a process oil, a lubricant, paraffin, liquid paraffin, petroleum asphalt, and Vaseline; a coal tar-based softener such as coal tar and coal tar pitch; a fat oil-based softener such as castor oil, linseed oil, rapeseed oil, and coconut oil; waxes such as beeswax, carnauba wax, and lanolin; fatty acid and fatty acid salt such as ricinoleic acid, palmitic acid, barium stearate, calcium stearate, and zinc laurate; and synthetic polymers such as petroleum resin, atactic polypropylene, and coumarone-indene resin. It is possible to use a single or a combination of two or more of such softeners.

The antioxidant may be used as necessary to improve heat resistance. It is possible to use various types of antioxidants known in the conventional art, and for examples, the antioxidants are an amine-based antioxidant, a hindered phenol-based antioxidant, or a sulfur-based antioxidant. The content of the antioxidant is set in a range in which the object of the present invention is not impaired. It is possible to use a single or a combination of two or more of such antioxidants. Since the sulfur-based antioxidant restrains the organic peroxide from crosslinking, an amount of the cross-linker needs to be increased such that the rubber compound of the present invention has the mechanical strength according to the amount of addition of the cross-linker.

It is possible to use a known compound used in normal rubber processing as the processing aid. For examples, the processing aids are: a higher fatty acid such as ricinoleic acid, stearic acid, palmitic acid, and lauric acid; salt of a higher fatty acid such as barium stearate, zinc stearate, and calcium stearate; and esters of higher fatty acids such as ricinoleic acid, stearic acid, palmitic acid and lauric acid. The content of a processing aid is 0.1 parts or higher by weight and 10 parts or lower by weight, to 100 parts by weight of an olefinic copolymer, and is, preferably, 3 parts or smaller by weight.

It is most preferable that the organic peroxide is used in crosslinking. In addition, it is preferable that the crosslinking aid is together used. For examples, crosslinking aids are: a quinone dioxime compound such as sulfur or p-quinone dioxime; a methacrylate compound such as polyethylene glycol dimethacrylate; an allyl compound such as diallyl phthalate, triallyl cyanurate; a maleimide compound, or divinylbenzene. The content of a crosslinking aid is 0.5 mol or higher and 2 mol or lower, to 1 mol of organic peroxides, and is, preferably, about 1 mol.

As an adhesive, a silane coupling agent, an acrylic acid-based (actor ZMA, actor ZA collectively manufactured by Kawaguchi Chemical Industry Co., Ltd.), or Hi-Cross M manufactured by SEIKO Chemical Corporation, ethylene glycol or the like may be used. The content of adhesive may be 1 part or larger by weight and 10 parts or smaller by weight to 100 parts by weight of an olefinic copolymer. In addition, it is possible to use a combination of two or more type thereof. Since zinc oxide improves heat aging resistance, 3 parts or larger by weight and 10 parts or smaller by weight of the zinc oxide is contained to 100 parts by weight of the olefinic copolymer.

It is possible to use other known rubber together as another resin component in the rubber compound of the present invention in a range in which the object of the present invention is not impaired. For example, rubbers are: natural rubber (NR); isoprene-based rubber such as isoprene rubber (IR); and conjugated diene rubber such as butadiene rubber (BR), styrene-butadiene rubber (SBR), acrylonitrile-butadiene rubber (NBR), or chloroprene rubber (CR). Preferably, it is possible to use an ethylene.propylene.nonconjugated diene copolymer (EPDM or the like) as an ethylene.α-olefin.nonconjugated polyene copolymer; however, it is also possible to use ethylene.α-olefinic copolymer rubber known in the conventional art such as an ethylene.propylene random copolymer (EPR).

It is possible to manufacture a crosslinked rubber formed body made of the rubber compound of the present invention in normal production conditions of a photovoltaic thermal collector such as: the temperature of the laminating apparatus . . . 155° C.; vacuum time (preheating) . . . 5 minutes; and pressing time . . . 15 minutes.

PRACTICAL EXAMPLE

Hereinafter, the present invention will be more specifically described on the basis of Examples; however, the present invention is not limited to Examples.

Olefinic rubber compounds used in Examples 1 to 6 and Comparative Examples 1 to 3 were prepared by the following methods. The composition of materials of the rubber compounds of Examples and Comparative Examples is shown in Table 1.

Example 1

The total amount of the following composite material (A) was put into 16 L bunbury mixer manufactured by Kobe Steel, Ltd. to reach a filling rate of 75%, was kneaded for ten minutes, and was taken out at an actual temperature of 150° C. After the temperature was checked to be 50° C. with a thermometer, an entire composite material (B) was put into a 10-inch open roll and was dispersed for ten minutes, and a rubber compound for the photovoltaic thermal collector was obtained. The rubber compound was molded to form a sheet having a thickness of 7 mm equal to an outer diameter of the resin pipe, two resin pipes were prepared to be spread all over without gaps in a 400 mm×400 mm-area glass module.

Composite Material (A) is as follows: 100 parts by weight of Mitsui EPT4021 as olefinic rubber; 1 part by weight of stearic acid manufactured by NOF corporation; 5 parts by weight of META-Z (active zinc oxide) manufactured by Inoue Calcium Corporation; 20 parts by weight of ketjen black EC 300J manufactured by Lion Corporation; and 0.5 parts by weight of irganox 1075J manufactured by BASF Composite Material (B) is as follows: 3.0 parts by weight of Hi-Cross M_manufactured by SEIKO Chemical Corporation; 0.5 parts by weight of methyl acrylate manufactured by Nippon Shokubai co., Ltd.; 1.0 part by weight of ethylene glycol #4000 (manufactured by Tokyo Chemical Industry Co., Ltd.); and 0.5 parts by weight of a silane coupling agent (SZ 6030) manufactured by Dow Corning Toray Co., Ltd.

Example 2

A rubber compound was obtained in the same method in Example 1 except that 20 parts by weight of ketjen black EC 300J were changed to 60 parts by weight of acetylene black (manufactured by Denka Company Limited).

Example 3

A rubber compound was obtained in the same method in Example 1 except that: Mitsui EPT4021 as olefinic rubber of composite material (A) was changed to Mitsui EPT4010; 20 parts by weight of ketjen black EC 300J was changed to 4 parts by weight of carbon nanotubes (Tokai Carbon Co., Ltd.) and 60 parts by weight of Asahi #60G manufactured by Asahi Carbon Co., Ltd.

Example 4

A rubber compound was obtained in the same method in Example 1 except that: Mitsui EPT4021 as olefinic rubber of composite material (A) was changed to Mitsui EPT4045; 20 parts by weight of ketjen black EC 300J was changed to 60 parts by weight of acetylene black; further, 10 parts by weight of novatec LF244E (manufactured by Japan Polyethylene Corporation) as low-density polyethylene was added.

Example 5

A rubber compound was obtained in the same method in Example 1 except that Mitsui EPT4021 as olefinic rubber of composite material (A) was changed to Mitsui EPT4045; 20 parts by weight of ketjen black EC 300J was changed to a blend of 40 parts by weight of acetylene black and 10 parts by weight of ketjen black.

Example 6

A rubber compound was obtained in the same method in Example 1 except that: Mitsui EPT4021 as olefinic rubber of composite material (A) was changed to Mitsui EPT14030; and 20 parts by weight of ketjen black EC 300J was changed to a blend of 50 parts by weight of furnace black and 10 parts by weight of ketjen black.

Comparative Example 1

A rubber compound was obtained in the same method in Example 1 except that: regular carbon black was used instead of 20 parts by weight of ketjen black EC 300J, and 90 parts by weight of Asahi #60G and 30 parts by weight of paraffin oil (manufactured by Idemitsu Kosan Co., Ltd.) were added.

Comparative Example 2

A rubber compound was obtained in the same method in Example 1 except that: regular carbon black was used instead of 20 parts by weight of ketjen black EC 300J; further, 70 parts by weight of Asahi #50G was added.

Comparative Example 3

A rubber compound was obtained in the same method in Example 1 except that: 40 parts by weight of ketjen black EC 300J was used instead of 20 parts by weight of ketjen black EC 300J; 10 parts by weight of Asahi #60G and 10 parts by weight of Asahi #50G were added.

The photovoltaic thermal collector having a structure in FIG. 1 was prepared by using the rubber compounds of Examples and Comparative Examples through the following procedure.

<1> Sample Preparation

The following members 1 to 6 are prepared.

Member 1: a white board glass having 400×400 mm area and a thickness of 3.2 t is used.

Member 2: six-inch single-crystal silicon (manufactured by Gintech Energy Corporation) is used as the power generating element.

Member 3: an EVA sealing member having a thickness of 450 μm (manufactured by Bridgestone Corporation) is used as the EVA sealing member.

Member 4: FIHF32 manufactured by Fujifilm Corporation is used as the back sheet.

Member 5: a hybrid rubber compound (having a sheet thickness of 7 mm) is used.

Member 6: a cross-linked polyethylene resin tube having a length of 40 cm, inner diameter of 5 mm, and outer diameter of 7 mm (manufactured by INOAC Corporation) are used.

<2> Lay-Up Process

Laid-up product for the photovoltaic thermal collector is obtained through the following procedure: The member 1, the member 3, the member 2, the member 3, the member 4, the member 5, the member 6, and the member 1 are stacked from bottom in this order; the resin pipe of the member 6 is disposed at a position which is 80 mm apart from a glass end; the hybrid rubber compound of the member 5 is spread without a gap in a way that the resin tubes are sandwiched.

<3> Laminating Process

The laid-up products for which were prepared through <2> Lay-up Process, were set on laminating apparatus PVL 1537 manufactured by Nisshinbo Mechatronics Inc. and was laminated under the conditions: at a heat plate temperature 160° C.; for six minutes in vacuum (five minutes of holding-pin standing time); and for 15 minutes pressing. Then the photovoltaic thermal collector was obtained.

<4> Evaluation Method of Rubber Compound

The basic properties of rubber compound of the present invention were evaluated with a crosslinked rubber sheet prepared through the following procedure: crosslinked rubber sheet was molded with test mold (140 mm×140 mm×2.0 mm) at a one-minute half-life temperature of the organic peroxide cross-linker with a Kohtaki multistage press under the following crosslinking conditions that preheating was performed for two minutes and heating was performed at 160° C. for 15 minutes. Basic properties of a test piece of the crosslinked rubber sheet were measured and evaluated by the following methods. Evaluation results of the basic properties are shown in Table 1.

<Evaluation of Basic Properties>

(1) Hardness

In accordance with JIS K 6253, A hardness was measured at a measurement temperature of 23° C. through a durometer method.

(2) Tensile Test (Strength•Elongation)

In accordance with JIS K 6251-2010, a tensile test was performed at the measurement temperature of 23° C. under a condition of the tensile rate of 500 mm/min and tensile strength and elongation were measured at the time of breakage of the crosslinked rubber sheet.

(3) Acetone Extract (% by weight)

In accordance with ASTM D 494, acetone extract was measured.

(4) Thermal Conductivity (W/(m·K))

In accordance with JIS H 8453, thermal conductivity was measured.

(5) Measurement of Crosslink Density

Crosslink density was measured through a method called the following solvent swelling method (Flory-Rehner method). A test piece of 20 mm×20 mm×2 mm was cut from a crosslinked rubber portion for the manufactured photovoltaic thermal collector. In accordance with JIS K 6258, the test piece was immersed and swelled in 100 ml of toluene having a temperature of 37° C. for 72 hours. Crosslink Density was obtained through the following equation (Equation 1) of Flory-Rehner applied with equilibrium swelling.

$$v=\{V_R+\ln(1-V_R)+\mu V_R^2\}/\{-V_0(V_R^{1/3}-V_R/2)\} \quad \text{(Equation 1)}$$

v: crosslink density (mol/cm$^3$)
$V_R$: volume fraction of pure rubber in swollen test piece
μ: interaction constant between rubber and solvent (0.49)
$V_0$: molecular volume of toluene (108.15 cm$^3$)
$V_R$ was obtained by the following equation (Equation 2).

$$V_R=V_r/(V_r+V_s) \quad \text{(Equation 2)}$$

$V_r$: volume of pure rubber in test piece (cm$^3$)
$V_s$: volume of solvent absorbed in test piece (cm$^3$)

Crosslink density (A) of the crosslinked rubber sheet for the evaluation of the basic properties was measured, and crosslink density (B) was measured by cutting a measurement sample of 2 g from an edge of the hot water producing portion (portion of rubber compound 50 in FIGS. 1 to 3) of the photovoltaic thermal collector. A degree of cross-linkage is obtained by (B/A)×100, and is shown as the degree of cross-linkage (%) at a region of product evaluation in Table 1.

<5> Product Evaluation

The photovoltaic thermal collector prepared by using the rubber compounds prepared in Practical Examples and Comparative Examples were evaluated regarding the following items. Results of the product evaluation are shown in Table 1.

(1) Handling Test

Evaluation points of handling tests are as follows and are shown in Table 1.

Evaluation Point, 3 points: Compound has low viscosity and it is possible to perform the lay-up process in a short time.

Evaluation Point, 2 points: Compound has high viscidity and it takes time to perform the lay-up process of the photovoltaic thermal collector.

Evaluation Point, 1 point: Compound has low viscosity, a shape is crushed, and it is not possible to perform the lay-up process.

(2) Test of Water Pressure Resistance

Evaluation points of tests of the water pressure resistance are as follows and are shown in Table 1.

Evaluation Point, 3 points: The glass portions on both sides of the resin pipe portion have no change at all.

Evaluation Point, 2 points: The glass portions on both sides of the resin pipe portion slightly swell.

Evaluation Point, 1 point: The glass portions on both sides of the resin pipe portion largely swell.

(3) Evaluation of Cracks in Silicon Cell

The number of silicon cells having cracks•chips of four silicon cells is shown in Table 1.

(4) Evaluation of External Appearance

Evaluation of external appearances of is as follows and is shown in Table 1.

Evaluation Point, 3 points: Bubbles or Foaming occurs by 0% of an entire area of the power generating portion.

Evaluation Point, 2 points: Bubbles or Foaming occurs by 3% of the entire area of the power generating portion.

Evaluation Point, 1 point: Bubbles or Foaming occurs by 10% of the entire area of the power generating portion.

(5) Height Ratio (%) of Resin pipe

A value obtained as a height ratio=B/A×100% of a diameter (B) measured after molding to a diameter (A) of the inner diameter of 5 mm (5 A) pipe having the outer diameter of 7 mm is shown in Table 1.

<6> Total Evaluation of Photovoltaic Thermal Collector (1) The photovoltaic thermal collector prepared by using the rubber compound of Example 1 uses conductive carbon black, and has the thermal conductivity of 0.3 W/mK or higher and high hardness of 85. Therefore, the photovoltaic thermal collector is obtained without crushing of the included resin pipes and without defects of bubbles or the like in the sealing member portion of the front-surface cell.

(2) The photovoltaic thermal collector prepared by using the rubber compound of Example 2 contains 60 parts by weight of acetylene black and is as good as that of Example 1.

(3) The photovoltaic thermal collector prepared by using the rubber compound of Example 3 uses the carbon nanotubes and the normal carbon black, and is as good as that of Example 1.

(4) The photovoltaic thermal collector prepared by using the rubber compound of Example 4 contains additional polyethylene resin, and is as good as that of Example 1.

(5) The photovoltaic thermal collector prepared by using the rubber compound of Example 5 contains the conductive ketjen black and acetylene black, and is as good as that of Example 1.

(6) The photovoltaic thermal collector prepared by using the rubber compound of Example 6 contains the blend of conductive ketjen black and furnace black, and the prepared photovoltaic thermal collector is as good as that of Example 1.

(7) In the photovoltaic thermal collector prepared by using the rubber compound of Comparative Example 1, the addition of normal carbon black results in insufficient thermal conductivity, and the rubber compound is soft. Therefore, an external appearance is defected, the resin pipes are crushed, and thereby the photovoltaic thermal collector is not prepared. In addition, the photovoltaic thermal collector is not preferable that a large amount of acetone is extracted; that is, oil components permeate through the resin pipes and thus the resin pipes become soft; the mechanical strength decreases; and the water-pressure resistance performance is remarkably reduced.

(8) In the photovoltaic thermal collector prepared by using the rubber compound of Comparative Example 2, foams of the power generating portion occur due to the addition of normal carbon black. Therefore, external appearance is defected, degree of cross-linkage decreases, and the water pressure resistance decreases, and thus the photovoltaic thermal collector does not bear water pressure.

(9) In the photovoltaic thermal collector prepared by using the rubber compound of Comparative Example 3, a large amount of contained conductive ketjen black results in a hard rubber compound. Therefore, the photovoltaic thermal collector has a defective external appearance and insufficient water pressure resistance, and thus it is not possible to prepare the photovoltaic thermal collector.

TABLE 1

|  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|
| <Composition of rubber compound: unit - part by weight> | | | | | | | | | |
| EPDM Type | Mitsui EPT4021 | Mitsui EPT4021 | Mitsui EPT4010 | Mitsui EPT4045 | Mitsui EPT4045 | Mitsui EPT14030 | Mitsui EPT4021 | Mitsui EPT4021 | Mitsui EPT4021 |
| Composition | 100 | 100 | 100 | 100 | 100 | 100 | 100 | 100 | 100 |
| Stearic acid | 1 | 1 | 1 | 1 | 1 | 1 | 1 | 1 | 1 |
| META-Z | 5 | 5 | 5 | 5 | 5 | 5 | 5 | 5 | 5 |
| Ketjen black | 20 | | | | 10 | 10 | | | 40 |
| Acetylene black | | 60 | | 60 | 40 | | | | |
| Carbon nanotubes | | | 4 | | | | | | |
| Asahi CB#60G(FEF) | | | 60 | | | 50 | 90 | | 10 |
| Asahi CB#50(SRF) | | | | | | | | 70 | 10 |
| Low density polyethylene | | | | 10 | | | | | |
| paraffin oil PW90 | | | | | | | 30 | | |
| Irganox 1076 | 0.5 | 0.5 | 0.5 | 0.5 | 0.5 | 0.5 | 0.5 | 0.5 | 0.5 |
| Hi-Cross M | 3.0 | 3.0 | 3.0 | 30 | 3.0 | 3.0 | 3.0 | 3.0 | 3.0 |
| Acrylic ester | 0.5 | 0.5 | 0.5 | 0.5 | 0.5 | 0.5 | 0.5 | 0.5 | 0.5 |
| Ethylene glycol | 1.0 | 1.0 | 1.0 | 1.0 | 0.5 | 0.5 | 0.5 | 0.5 | 0.5 |
| Silane coupling agent (SZ6030) | 0.5 | 0.5 | 0.5 | 0.5 | 0.5 | 0.5 | 0.5 | 0.5 | 0.5 |
| <Evaluation of basic properties> | | | | | | | | | |
| HA (JISA) | 85 | 89 | 80 | 89 | 88 | 86 | 75 | 80 | 91 |
| TB (MPa) | 12 | 14 | 13 | 16 | 16 | 12 | 9 | 8 | 10 |
| EB (%) | 200 | 300 | 450 | 460 | 210 | 300 | 540 | 290 | 150 |
| Acetone extract (% by mass) | 2 | 2 | 1 | 1 | 2 | 1 | 25 | 2 | 2 |
| Thermal conductivity (W/mK) | 0.50 | 0.45 | 0.45 | 0.46 | 0.39 | 0.40 | 0.20 | 0.20 | 0.60 |
| <Results of product evaluation> | | | | | | | | | |
| Handling properties | 3 | 3 | 3 | 3 | 3 | 3 | 1 | 2 | 3 |
| Water pressure resistance | 3 | 3 | 3 | 3 | 3 | 3 | 1 | 2 | 1 |
| Cracks in cell (the number of cracks in four cells) | 0 | 0 | 0 | 0 | 0 | 0 | 2 | 3 | 3 |
| Evaluation of external appearance | 3 | 3 | 3 | 3 | 3 | 3 | 1 | 1 | 1 |
| Height ratio of resin pipe (%) | 92 | 95 | 88 | 96 | 90 | 93 | 45 | 55 | 99 |
| Degree of cross-linkage (%) | 100 | 100 | 100 | 100 | 100 | 100 | 60 | 70 | 100 |

As many apparently widely different embodiments of the present invention can be made without departing from the spirit and scope thereof, it is to be understood that the invention is not limited to the specific embodiments thereof except as defined in the appended claims.

What is claimed is:

1. An olefinic rubber compound,
wherein the olefinic rubber compound adheres to an anti-light receiving side of a photovoltaic module, and the olefinic rubber compound has a thermal conductivity of 0.3 W/mK or higher, a rubber hardness of Japanese Industrial Standards A in the range of 80 to 90, a mechanical strength of 10 MPa or higher, an elongation in the range of 150% to 700%, and an amount of acetone extract of 5% or smaller.

2. The olefinic rubber compound according to claim 1, wherein the olefinic rubber compound is an ethylene-α-olefin copolymer.

3. The olefinic rubber compound according to claim 1, comprising conductive carbon black, carbon nanotubes, and fillers.

4. The olefinic rubber compound according to claim 1, comprising an organic peroxide cross-linker of which a one-minute half-life temperature is 182° C. or lower.

5. The olefinic rubber compound according to claim 1, comprising polyethylene resin having a density in the range of 0.91 g/cm$^3$ to 0.93 g/cm$^3$,
wherein a content of the polyethylene resin is in the range of 10 parts by weight to 35 parts by weight.

* * * * *